(12) United States Patent
Ishikawa et al.

(10) Patent No.: US 11,587,637 B1
(45) Date of Patent: Feb. 21, 2023

(54) APPARATUSES, SYSTEMS, AND METHODS FOR ERROR CORRECTION OF SELECTED BIT PAIRS

(71) Applicant: MICRON TECHNOLOGY, INC., Boise, ID (US)

(72) Inventors: Toru Ishikawa, Kanagawa (JP); Takuya Nakanishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/445,465

(22) Filed: Aug. 19, 2021

(51) Int. Cl.
*G11C 29/00* (2006.01)
*G11C 29/42* (2006.01)
*G06F 11/10* (2006.01)
*G11C 29/52* (2006.01)

(52) U.S. Cl.
CPC .......... *G11C 29/42* (2013.01); *G06F 11/1048* (2013.01); *G11C 29/52* (2013.01)

(58) Field of Classification Search
CPC ...... G11C 29/42; G11C 29/52; G06F 11/1048
See application file for complete search history.

(56) References Cited

U.S. PATENT DOCUMENTS

| | | | |
|---|---|---|---|
| 8,516,339 B1 * | 8/2013 | Lesea | H03M 13/2906 714/763 |
| 2007/0079226 A1 | 4/2007 | Hoya et al. | |
| 2008/0034270 A1 | 2/2008 | Onishi et al. | |
| 2008/0049876 A1 * | 2/2008 | Karam | H04L 27/2014 375/336 |
| 2010/0257429 A1 | 10/2010 | Noguchi | |
| 2014/0339631 A1 * | 11/2014 | Ting | H01L 27/228 257/334 |
| 2021/0200630 A1 * | 7/2021 | Ishikawa | G06F 11/1048 |
| 2022/0066871 A1 * | 3/2022 | Lu | G06F 21/552 |
| 2022/0179740 A1 * | 6/2022 | Roy | G11C 29/00 |

OTHER PUBLICATIONS

"PCT Appl. As Filed under PCT/US2022/074543, filed Aug. 4, 2022".
International Search Report and Written Opinion for International Patent Application No. PCT/US2022/074543 dated Nov. 18, 2022, pp. all.

* cited by examiner

*Primary Examiner* — Albert Decady
*Assistant Examiner* — Enamul M Kabir
(74) *Attorney, Agent, or Firm* — Dorsey & Whitney LLP

(57) ABSTRACT

Apparatuses, systems, and methods for error correction for selected bit pairs. A memory device may include an error correction code (ECC) circuit which may receive data bits as part of a read or write operation and generate parity bits based on the data bits. The parity bits may be used to locate and correct errors in the data bits. The parity bits may be generated based on a syndrome value. Each of the individual data bits may be associated with a syndrome value. In addition, some selected pairs of data bits may also be associated with a syndrome value. This may allow the ECC circuit to correct errors in individual data bits or in one of the selected pairs of data bits. In some embodiments, the selected pairs may represent adjacent memory cells along a word line.

20 Claims, 8 Drawing Sheets

FIG. 5

APPARATUSES, SYSTEMS, AND METHODS FOR ERROR CORRECTION OF SELECTED BIT PAIRS

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

BRIEF DESCRIPTION OF THE DRAWINGS

FIG. 5 is a matrix of ECC values according to some embodiments of the present disclosure.

DETAILED DESCRIPTION

Figure 1:
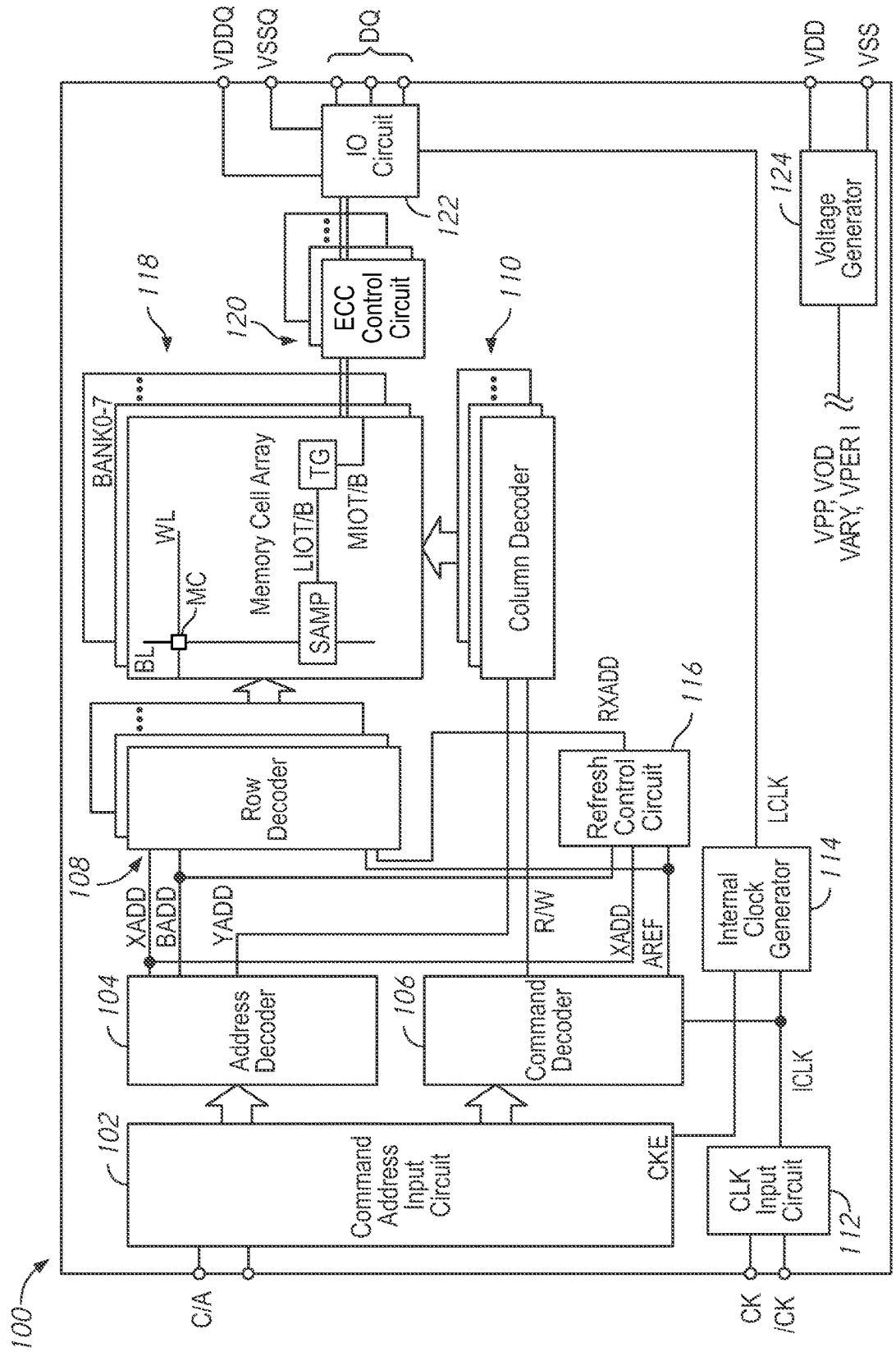
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include i data bits and k parity bits, which may be used to correct up to j of the data bits. During a write operation the parity bits may be generated by an error correction code circuit based on the data written to the memory cells of the row. During a read operation the error correction code circuit may use the parity bits to determine if the read data bits are correct, and may correct any errors which are found.

An error correction code (ECC) circuit may be used to generate the parity bits based on written data during a write operation and compare the read data and read parity bits to locate errors. As part of the read operation, the ECC circuit may generate new parity bits based on the read data in a manner similar to generating the parity bits. The ECC circuit may then compare the new parity bits to the read parity bits in order to locate any errors. A logic tree (e.g., a tree of XOR gates) may be used to generate syndrome bits, which the parity bits may be based on. For example, the logic tree may receive N data bits, and generate M syndrome bits. Each syndrome bit may have a state which is associated with one of the N data bits. In this manner, errors in the N data bits may be located and corrected. However, conventional ECC schemes may fail when there are multiple errors in the N data bits. It may be advantageous to generate a pattern of syndrome bits which can correct single errors and also errors in certain selected pairs of the data bits.

The present disclosure is directed to apparatuses, systems, and methods for error correction for selected bit pairs. In a given memory device, certain patterns of failure may be more common than others. For example, if multiple memory cells fail, it may be more likely that they are adjacent to each other along a word line. As previously discussed, a given set of N data bits may be used to generate M syndrome bits, and each of the N data bits may be associated with a unique value of the M syndrome bits. However, the total number of values of the syndrome bits may be greater than the number of data bits (e.g., $2^M > N$). Accordingly, there may be 'extra' syndrome values which are not associated with a single bit error (e.g., not associated with a data bit). In an ECC circuit of the present disclosure a first portion of the syndrome values may be associated with individual data bits (e.g., to correct errors in single bits), while a second portion of the syndrome values may be associated with selected pairs of data bits (e.g., to correct errors in the selected pair).

In some embodiments, the pairs may be selected to leverage an existing architecture of the ECC circuit. For example, a logic tree of the ECC circuit may generate a first syndrome value associated with a first data bit, and a second syndrome value associated with a second data bit. The first and the second syndrome values may be combined (e.g., XOR'd) to generate a third syndrome value which is associated with the first and the second data bit. In this way, syndromes may be generated for selected pairs without the need to increase the size of the ECC circuit.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data (e.g., by changing a state of the identified bit(s) which are in error). The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit 122 and may generate 8 parity bits based on those 128 data bits. The 128 data bits and the 8 parity bits (e.g., 136 total bits) may be written to the memory array 118.

As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 3.

The ECC circuit 120 may include a syndrome generator (e.g., a logic tree) which receives the data bits and generates a syndrome based on those data bits. The syndrome may represent a value of the parity bits. For example, the parity bits may be treated as a binary number, and each value may represent a different value of the syndrome. The value of the syndrome may be used to locate an error in the data bits. In an ECC circuit of the present disclosure some syndrome values may be assigned to individual data bits, while some syndrome values may be assigned to selected pairs of data bits. In some embodiments, the selected pairs may represent memory cells which share a word line and which are adjacent to each other. An example scheme for grouping memory cells into selected pairs is discussed in more detail in FIG. 4.

During an example read operation, the ECC circuit 120 may receive read data and parity data from the memory array 118. The ECC circuit 120 may generate a syndrome and compare that syndrome to the read parity to locate errors. In some situations the syndrome may have a value which indicates an error in a single read bit. The ECC circuit 120 may correct the error by changing a state of the read bit. In some situations, the syndrome may have a value which indicates an error in a pair of the read bits. The ECC circuit 120 may correct the error by changing a state of both of the read bits.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
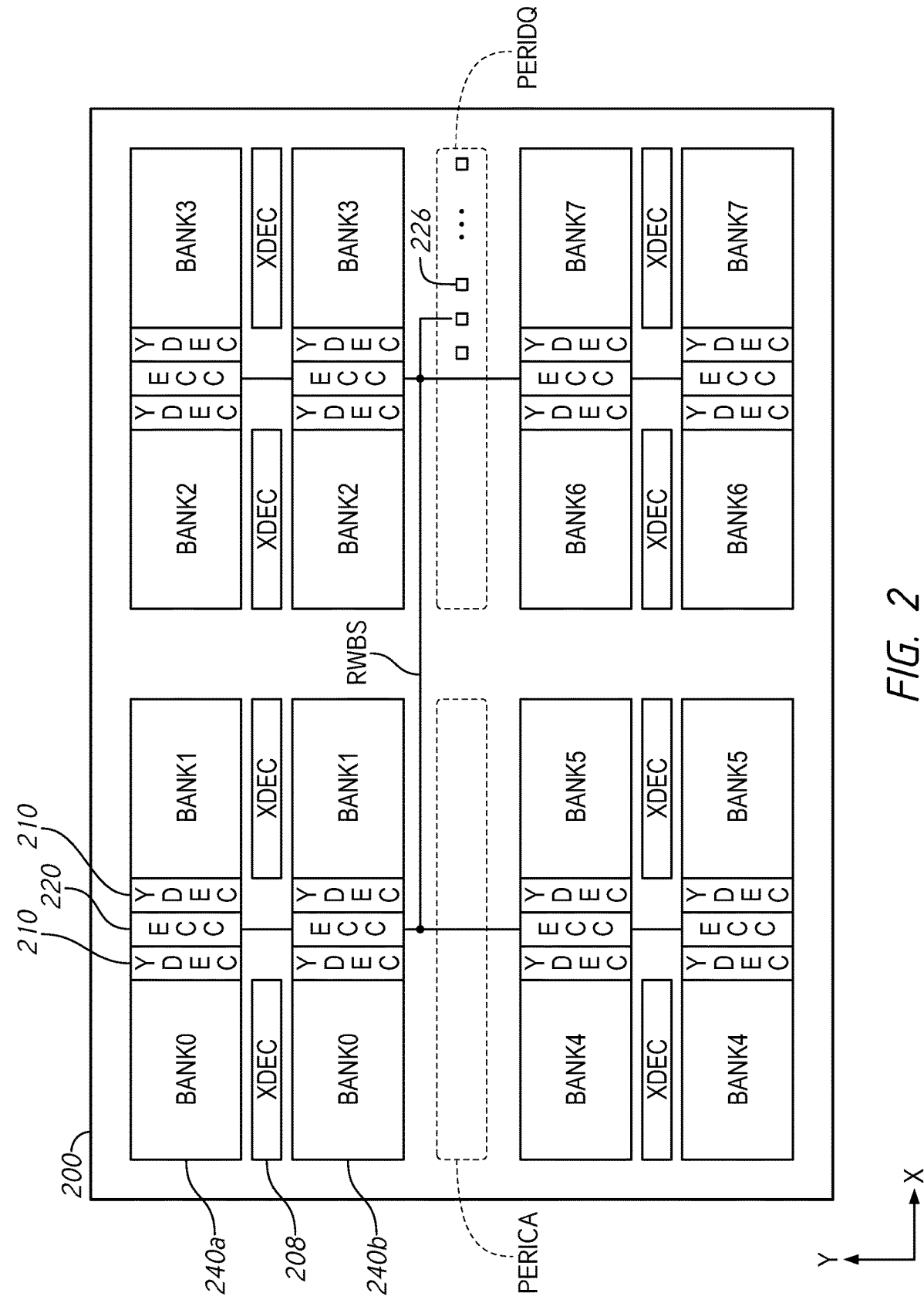
FIG. 2 is a block diagram of a memory device according to some embodiments of the present disclosure.

FIG. 2 is a block diagram of a memory device according to some embodiments of the present disclosure. The memory device 200 shows an example layout of certain components which are used as part of access operation in the memory device 200. Other components may be omitted for the sake of clarity. The memory device 200 may, in some embodiments, be included in the memory device 100 of FIG. 1.

The memory device 200 includes a number of banks 240, which are part of a memory array. The banks 240 may be divided into a first portion 240a of the bank and a second portion 240b of the bank, with a row decoder 208 positioned between the sections. The two sections of a given bank 240 and the row decoder 208 may be arranged along a first direction (e.g., a y-axis). Each bank 240 may be separated from another bank by a column decoder 210 associated with the first bank, an error correction region 220 and a column decoder 210 associated with the second band. The banks, column decoders 210, and error correction region 220 may be laid out along a second axis (e.g., an x-axis) which is orthogonal to the first axis. The banks of the memory device 200 may be arranged in an array along the x-y plane.

There may be an error correction region 220 and column decoder 210 for each portion of a given bank 240. The error correction region 220 may be coupled to one or more DQ pads 226 (e.g., through an I/O circuit) to send and receive data outside the device 200. The DQ pads 226 (and I/O circuits etc.) may be located in a PERIDQ region between the memory banks 240, and other components of the memory device 200 (e.g., the command address input circuit) may be located in a PERICA region between the memory banks 240.

The ECC region 220 includes one or more ECC control circuits used to correct the data bits which are stored in the memory banks 240 associated with that ECC region 220. For example, each ECC region 220 may include ECC control circuits which manage the portions of the banks on either side of that ECC region 220. For example a first ECC region 220 may be associated with the portion 240a and a second ECC region 220 may be associated with the portion 240b. In some embodiments, the ECC region 220 may include an ECC control circuit which corrects the data for either of the banks associated with that ECC region 220, depending on which of the banks is active. In some embodiments, the ECC region 220 may be extended (e.g., in the y direction) and may include one or more ECC control circuits which may manage both portions (e.g., 240a and 240b) of a bank.

Figure 3:
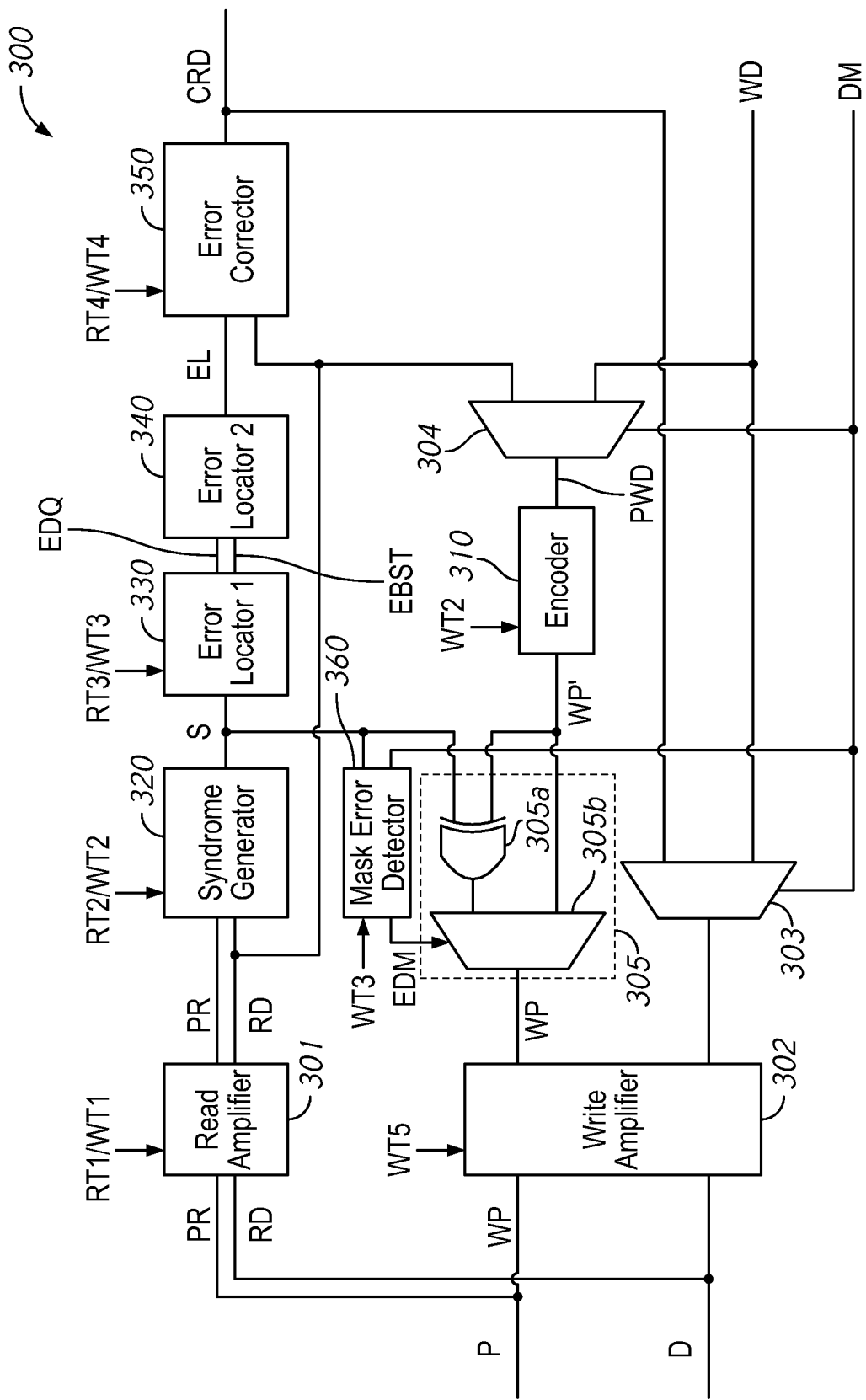
FIG. 3 is a schematic diagram of an error correction code (ECC) control circuit according to some embodiments of the present disclosure.

FIG. 3 is a schematic diagram of an error correction code (ECC) control circuit according to some embodiments of the present disclosure. The ECC control circuit 300 of FIG. 3 may, in some embodiments, be included in the ECC circuit 120 of FIG. 1 and/or 220 of FIG. 2. The ECC control circuit 300 may receive write data bits WD and may generate written parity bits WP. These may be provided to the memory array as data bits D and parity bits P. The ECC control circuit 300 may receive data D from the memory array as read data RD and parity bits P as read parity bits PR and may generate corrected data bits CRD based on the bits RD and PR.

During an example read operation, the read amplifier 301 is activated in response to the timing signal RT1 to amplify the read parity bits PR and read data RD. The amplified bits PR and RD are provided to a syndrome generator circuit 320, which is activated in response to a timing signal RT2, which activates at a time after RT1 is active. The syndrome generator 320 provides syndrome bits S based on the read bits RD and PR. In some embodiments, the number of syndrome bits S may match the number of parity bits PR. The syndrome bits S are provided to an error locator circuit 330. The syndrome bits S may have a state which indicates which indicates which of the read data RD bits, or which pair of read data bits, are in error.

The error locator circuit 330 provides a first set of error determination signals EBST and a second set of error determination bits EDQ based, in part, on the syndrome bits S. The error locator circuit 330 may activate responsive to a timing signal RT3, which may activate after the signal RT2. Data provided to/received at the DQ terminals may be organized into bursts on a number of different DQ terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to an error locator circuit 340. The error locator circuit 340 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error position signal EL is provided to error corrector circuit 350. The error corrector circuit 350 also receives the read data RD and corrects one or more error bits in the RD based on the error location signal EL. For example, if an nth bit of the error location signal EL is at a high logical level, then the error corrector circuit 350 may change a state of the nth read bit RD. The error corrector circuit 350 may provide the corrected read data CRD. The error corrector circuit 350 may be activated in response to the timing signal RT4, which may be activated after the signal RT3. The corrected read data CRD may be provided to the DQ pads and read off of the device.

In an example write operation to the memory device, the ECC control circuit 300 may receive write data WD and a data mask signal DM. A first multiplexer 303 may synthesize the write data WD and the corrected read data CRD based on the data mask signal DM. The first multiplexer 303 may provide the data D, which is written to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

A second multiplexer 304 may synthesize the write data WD and the read data RD based on the data mask signal. The second multiplexer 304 may provide parity write data PWD. The parity write data PWD may be provided to an encoder circuit 310, which may encode the parity data PWD into the write parities WP'. The write parities WP' are provided to a converter circuit 305 which generates the write parities WP, which are written to the memory array as the parity bits P.

The converter circuit 305 includes an XOR logic gate 305a and a third multiplexer 305b. The XOR logic gate 305a has input terminals coupled to the syndrome bits S and the write parity bits WP'. The XOR logic gate 305a provides an output which is at a high logical level when the syndrome bite S is different from the associated write parity bit WP'. The third multiplexer 305b provides either the output of the XOR logic gate 305a or the write parity WP' as the write parity WP. The multiplexer 305b choses the source of the write parity WP bits based on a conversion signal EDM. When the conversion signal EDM is active, the write parity WP is the output of the XOR gate 305a. When the conversion signal EDM is inactive, the signal WP' is provided as the signal WP.

A mask error detector circuit 360 provides the signal EDM based on the syndrome bits S and on the data mask DM. The mask error detector circuit 360 may determine whether or not burst data to which an error bit belongs and burst data masked by the data mask signal DM are coincident. If they are coincident, then the signal EDM may be activated. If they are not coincident, the signal EDM may remain inactive.

Figure 4:
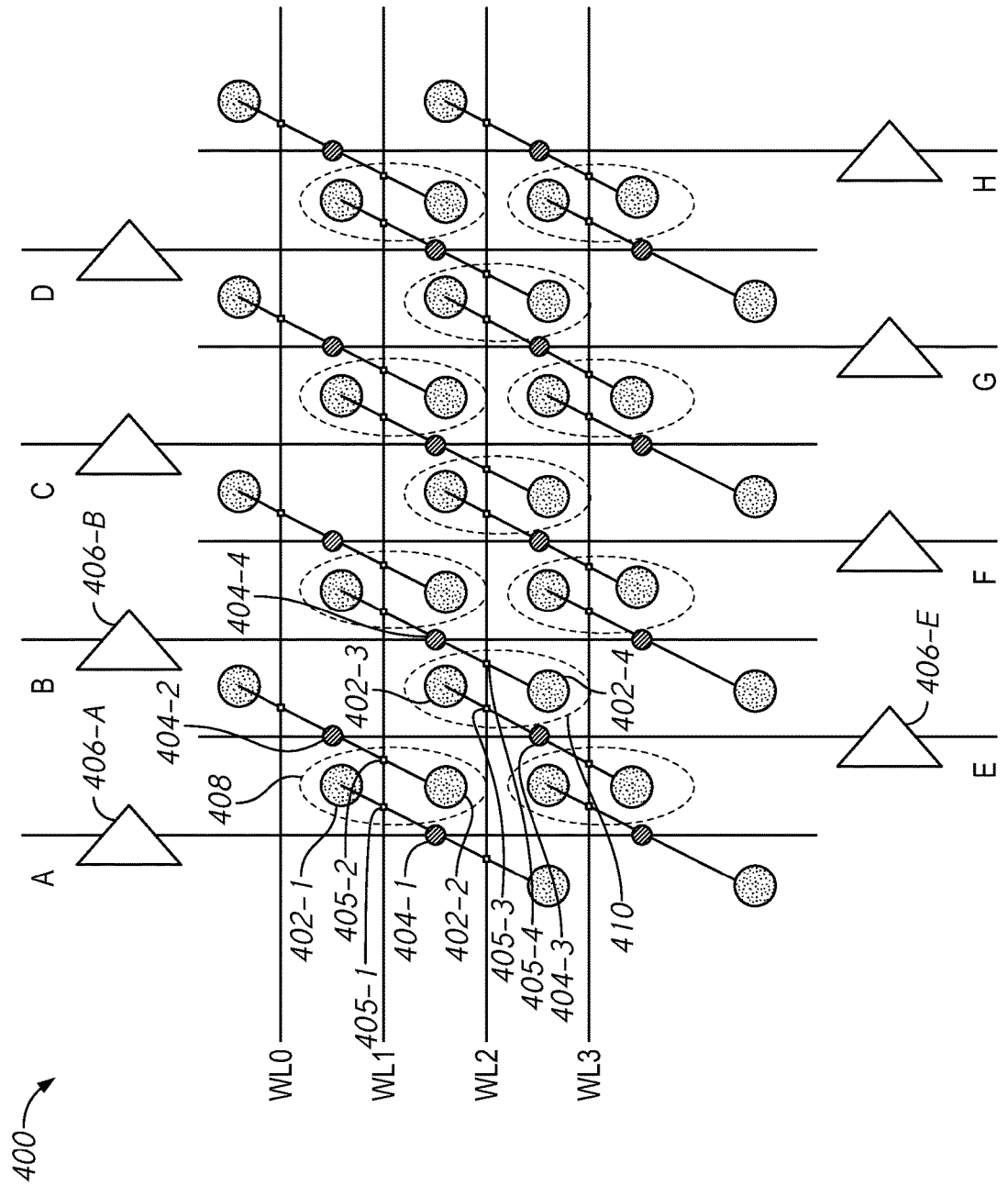
FIG. 4 is a block diagram of a memory array according to some embodiments of the present disclosure.

FIG. 4 is a block diagram of a memory array according to some embodiments of the present disclosure. The memory array 400 includes a number of word lines WL0 to WL3 and a number of bit lines, here labelled A to H. A number of memory cells 402 are each coupled to a word line and a bit line. For example, a memory cell 402-1 is coupled to the word line WL1 and the bit line A. The memory array 400 shows a representative manner in which certain pairs of memory cells may be selected for error correction purposes. Other schemes for memory array organization and for grouping memory cells may be used in other example embodiments. The memory array 400 may, in some embodiments, represent a portion of the memory array 118 of FIG. 1.

Each memory cell 402 is coupled to a contact 404 along a bit line, which in turn is coupled to a sense amplifier 406. At a crossing of the line coupling the memory cell 402 to the associated contact 404 there is a switch 405, which is active when that word line is open. Accordingly, when the word line is open, the memory cells 402 along that word line are coupled to their respective bit lines and the sense amplifiers may be used to read or write data from/to the memory cell 402. For example, the memory cell 402-1 is coupled to a contact 404-1 by switch 405-1 which is along the bit line A coupled to the sense amplifier 406-A.

The memory cells 402-1 and 402-2 may be adjacent to each other along a same word line, with the memory cell 402-1 coupled to the bit line A, and the memory cell 402-2 coupled to the bit line E, which is adjacent to the bit line A. If there was a failure which shorted the memory cell 402-1 to 402-2, then when the word line WL1 is activated, both of the shorted memory cells 402-1 and 402-2 may be active at the same time, and may generate a pair of bits (e.g., as read from bit lines A and E) which are corrupted by the failure. Accordingly dotted line 408 indicates that memory cells 402-1 and 402-2 may be grouped together for error correction purposes. In an analogous fashion, circle 410 indicates that memory cells 402-3 and 402-4, which are adjacent to each other along word line WL2 and coupled to bit lines E and B respectively, are grouped together for ECC purposes. It should be noted that while memory cells 402-2 and 402-3 are drawn as adjacent to each other, they are not adjacent along a single wordline (e.g., 402-2 is coupled to WL1 and 402-3 is coupled to WL2). Accordingly even if memory cells 402-2 and 402-3 were to become shorted, they may represent a less pressing problem than memory cells 402-1 and 402-2, since the memory cells 402-2 and 402-3 do not share a word line.

As may be seen from the diagram of FIG. 3, many pairs of memory cells may be selected as indicated by the dotted lines. The selected pairs may represent memory cells which are adjacent to each other along a word line. The selected pairs may be identified by which bit lines are paired, which in turn may depend on whether the word line is even or odd. For example, odd word lines may pair bit lines A-E, B-F, C-G, and D-H, while even bit lines may pair E-B, F-C, G-D, etc. As explained in more detail in FIG. 7, this may be leveraged to help re-use logic tree structure between even and odd bit lines.

Figure 5:
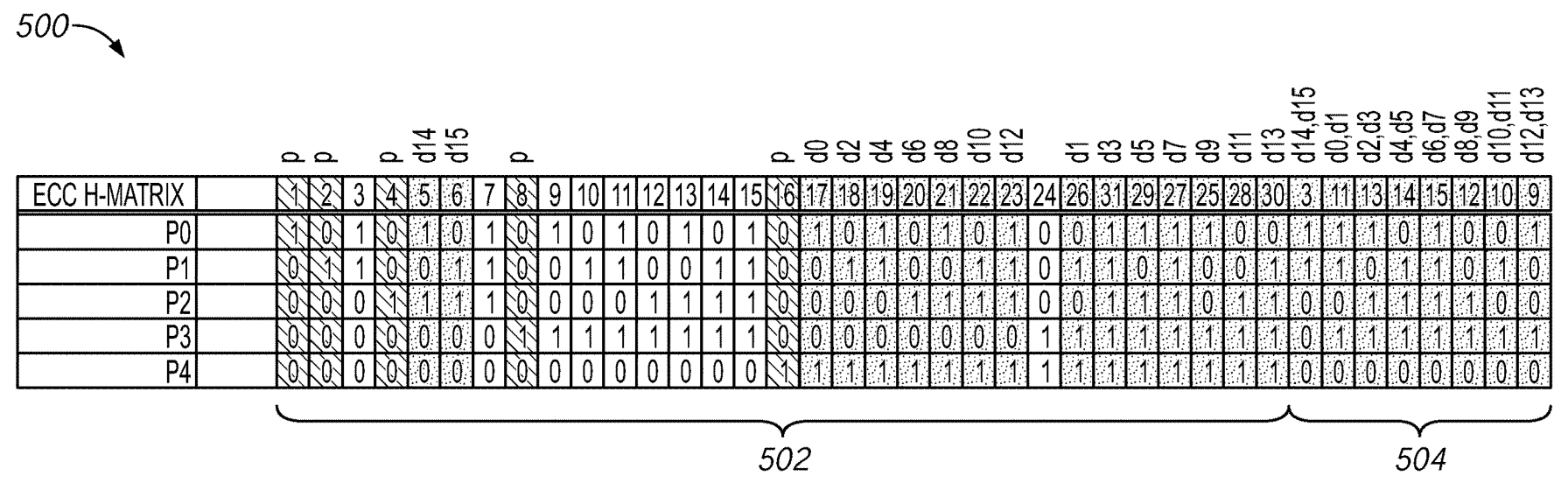
Figure 6:
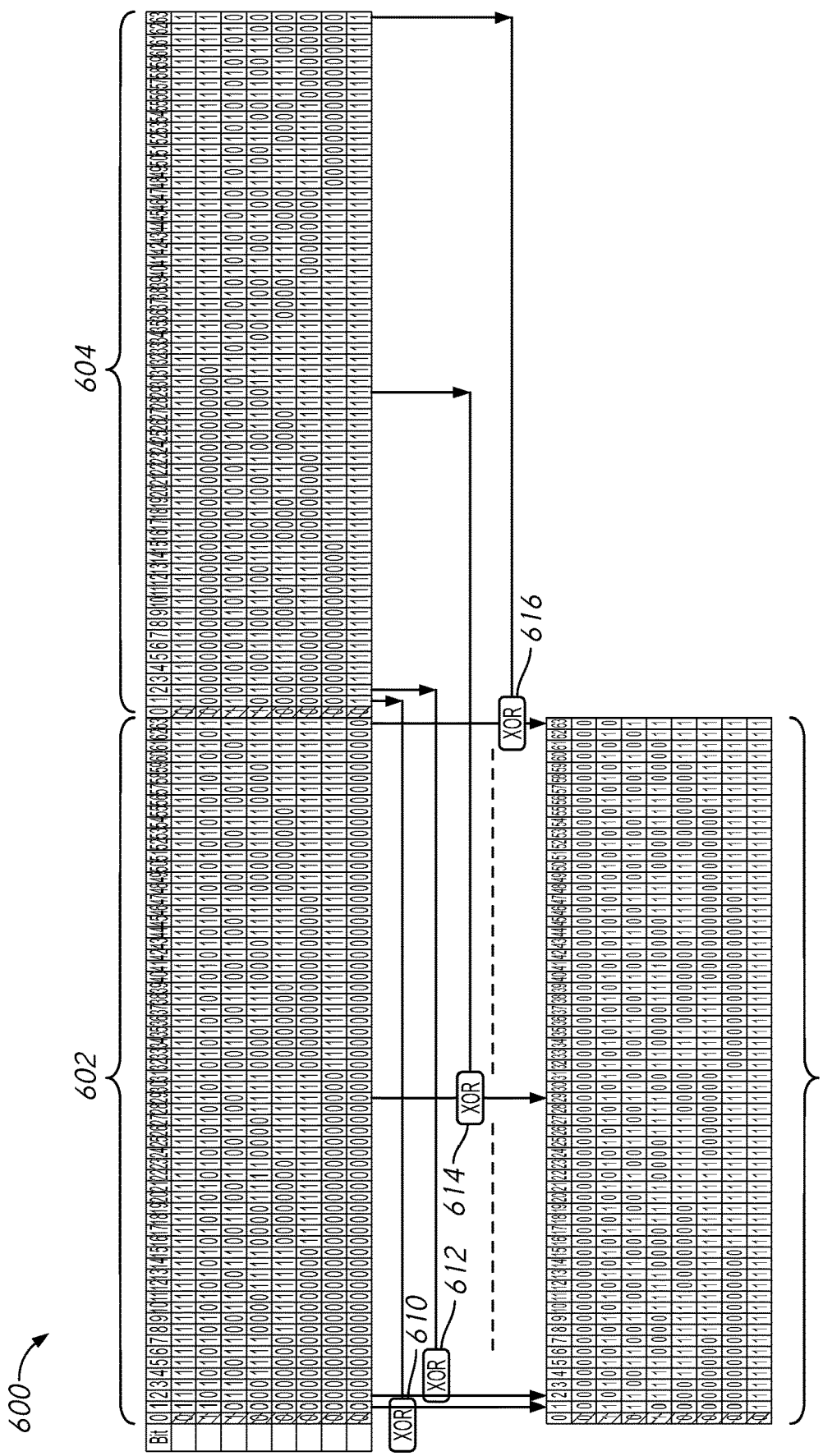
FIG. 6 is a matrix of ECC values according to some embodiments of the present disclosure.

FIG. 5 is a matrix of ECC values according to some embodiments of the present disclosure. The matrix 500 may represent the logic that an ECC circuit uses to generate syndrome values. For example, the matrix 500 may represent the logic used by a syndrome generator, such as the syndrome generator 320 of FIG. 3. The matrix 500 represents an example memory which uses 5 parity bits (P0 to P4) and 16 data bits d0 to d15. Other numbers of data and parity bits may be used in other examples. For example, FIG. 6 shows an example with 8 parity bits and 128 data bits.

The matrix 500 shows rows labelled P0 to P4, each of which represents a parity bit, and each column represents a state of those parity bits. The different columns are labelled 1 to 30 to represent the different states (or values) of the parity bits, where the labels represent the state of the parity bit as if it was a binary number. Each state of the parity bits may represent a syndrome value. Certain syndrome values may not be used, for example syndrome value 0 (e.g., 00000) and syndrome value 32 (e.g., 11111) may be reserved. Similarly, the syndrome values 1, 2, 4, 8, and 16 are reserved as parity check bits, here labelled 'p'. The remaining values 3, 5-7, 9-15, and 17-30 may be assigned to data bits in order to correct those date bits.

The matrix 500 is shown as having a first section 502 and a second section 504. The first section 502 shows the syndrome values which are used for single bit failure correction. So for example a syndrome value of 5 is associated with the data bit d14, the syndrome value of 6 is associated with the data bit d15 and so forth. Since there are 16 data bits, and 25 valid syndrome values (e.g., 32 total values—7 values which are reserved), there are 9 values which are not used for single bit error correction (e.g., syndrome values 3, 7, 9-15 and 24).

As shown by the second section 504, the syndrome values which were not assigned to single bit errors may be assigned to selected pairs of data bits. So for example the syndrome value 11 is assigned to data bits d0 and d1, the syndrome value 12 is assigned to d2 and d3, and so forth. The different data bits may be assigned to different syndrome values such that the syndrome value associated with a pair of data bits is based on a combination of the syndrome values associated with each of the individual data bits in that selected pair. For example, the data bit d0 is associated with a syndrome value of 17 (10001) and the data bit d1 is associated with the syndrome value of 26 (11010). The pair d0, d1 is associated with the syndrome value of 11 (01011) which is the XOR of 17 and 26.

The matrix 500 of FIG. 5 may represent a layout of the logic trees used to generate the parity bits from the data bits. For example, each row may represent the data bits which are combined together to generate the parity bit. If there is a '1' in the table entry, it may indicate that the specified data bit is provided to the logic tree which generates that parity bit, while a 0 may indicate that the data bit in that column is not used to generate the parity bit.

FIG. 6 is a matrix of ECC values according to some embodiments of the present disclosure. The matrix 600 may generally be similar to the matrix 500 of FIG. 5, except that the matrix 600 shows an example with 8 parity bits (and therefore 256 total syndrome values) and 128 data bits. Unlike in the matrix 500 of FIG. 5, individual assignments of data bits and data pairs to different syndrome values are not shown. Instead, FIG. 6 illustrates a scheme for dividing an ECC matrix into different sections associated with single bit repair and combining the syndrome values in those sections to generate pair bit repair syndrome values. For the sake of brevity, features described with respect to FIG. 5 will not be repeated with respect to FIG. 6.

The matrix 600 includes a first section 602 of syndrome values and a second section 604 of syndrome values. Since there are 128 data bits, each section 602 and 604 includes 64 syndrome values, each of which is associated with one of the 128 data bits. Each selected pair of data bits may have a first data bit assigned to the first section and a second data bit assigned to the second section. For example, if the syndrome values in the sections 602 and 604 are each labelled from 0 to 64 (with value 0 reserved) then a given pair may have a data bit assigned to syndrome value 1 in section 602 and syndrome value 1 in section 604. In an example embodiment, such as the one described in FIG. 4, where the paired data are from adjacent memory cells along a word line, then memory cells may be alternately assigned to the first section 602 or the second section 604.

The section 606 shows syndromes used for paired bit error correction. Each syndrome value in the third section 606 may be generated by XORing the corresponding values in the first section 602 and second section 604. For example, the XOR gate 610 may combine the syndrome 1 of section 602 and the syndrome 1 of section 604 to generate syndrome 1 of section 606. Accordingly, the syndrome 1 of section 606 may be associated with both of the data bits associated with syndrome 1 of section 602 and syndrome 1 of section 604. Similarly, XOR gate 612 combines syndrome values 2, XOR gate 614 combines syndrome values 29, and XOR gate 616 combines syndrome values 63.

Figure 7:
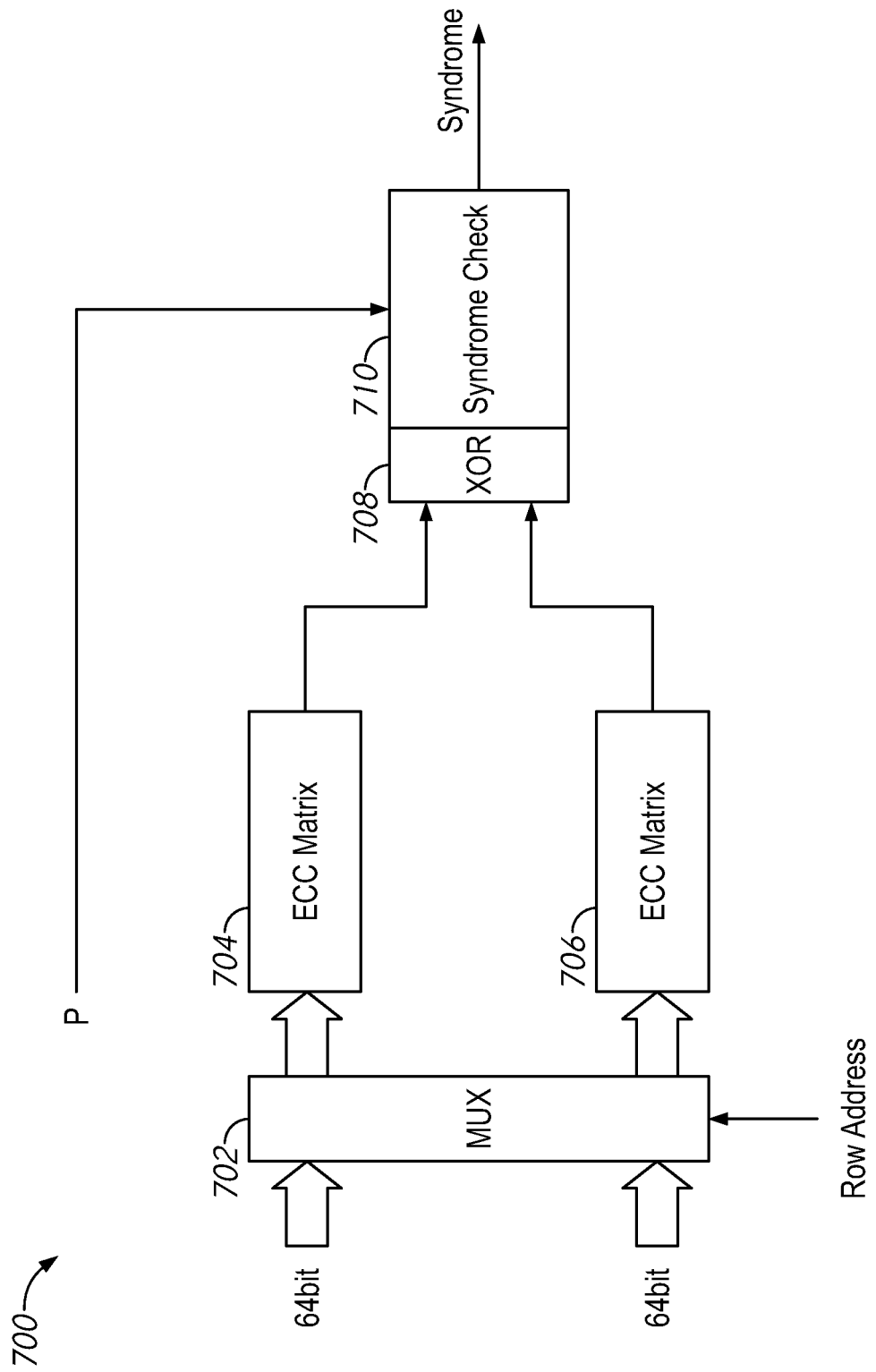
FIG. 7 is a block diagram of a syndrome generator according to some embodiments of the present disclosure.

FIG. 7 is a block diagram of a syndrome generator according to some embodiments of the present disclosure. The syndrome generator 700 may, in some embodiments, be included in the syndrome generator 320 of FIG. 3. The syndrome generator 700 may, in some embodiments, be used to implement the ECC logic described in the matrix 600 of FIG. 6. In the example embodiment of FIG. 7, 128 data bits may be used to generate 8 parity bits, which are associated with the 128 individual data bits and 64 selected pairs of the data bits. Other numbers of data and parity bits may be used in other example embodiments.

A first logic tree 704 receives a first portion of the data (e.g., 64 bits) and generates a first set of preliminary parity bits based on a first set of syndrome values (e.g., based on the section 602 of FIG. 6). A second logic tree 706 receives a second portion of the data and generates a second set of preliminary parity bits based on a second set of syndrome values (e.g., based on the section 604 of FIG. 6).

As previously discussed with respect to FIG. 4, the pairing of memory cells may depend on which word line is accessed. Even and odd word lines may have different patterns of memory cells which are adjacent to each other. Multiplexer 702 receives the data bits and scrambles them to adjust for the alternating patterns based on the accessed row address. For example, the multiplexer may scramble the input data based on whether the row address is even or odd.

The preliminary parity bits may be combined by XOR logic 708 to generate 8 parity bits (e.g., based on section 606 of FIG. 6). During a read operation, syndrome check logic may compare the generate parity to the read parity bits to determine a syndrome value which may be used to repair the read data. During a write operation, the XOR logic 708 may provide an 8 bit syndrome which may be written as the parity to the memory array along with the data.

Figure 8:
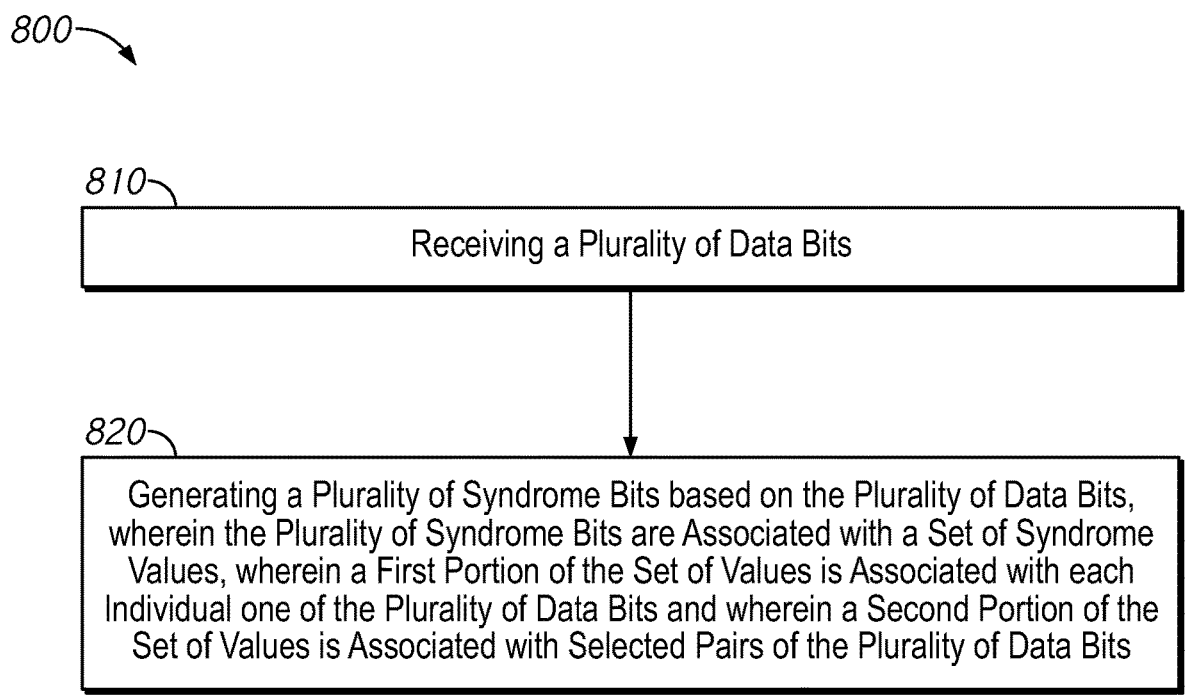
FIG. 8 is a flow chart of a method according to some embodiments of the present disclosure.

FIG. 8 is a flow chart of a method according to some embodiments of the present disclosure. The method 800 may, in some embodiments, be implemented by one or more of the apparatuses described in FIGS. 1-7.

The method 800 includes block 810, which describes receiving a plurality of data bits. The plurality of data bits may be received by an ECC circuit. The plurality of data bits may be received from data terminals as part of a write operation to a memory. The plurality of data bits may be received from a memory array as part of a read operation.

Block 810 may generally be followed by block 820, which describes generating a plurality of syndrome bits based on the plurality of data bits. A syndrome generator (e.g., 320 of FIG. 3) of the ECC circuit may generate the syndrome bits based on a set of syndrome values (e.g., as described in FIGS. 5-6). A first portion of the set of values may be associated with each individual one of the plurality of data bits and a second portion of the set of values may be associated with selected pairs of the plurality of data bits.

During a write operation, the plurality of syndrome bits may be used to generate a plurality of parity bits, which may be written to a memory array along with the plurality of data bits. During a read operation, the plurality of syndrome bits may be used to correct errors in the plurality of read data. For example the ECC circuit may identify an error in the plurality of data bits and then correct the identified error.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a word line coupled to a first memory cell and a second memory cell;
   an ECC circuit configured to receive a plurality of parity bits and a plurality of data bits including a first data bit associated with the first memory cell and a second data bit associated with the second memory cell, wherein the ECC circuit is configured to generate a plurality of syndrome bits based on the plurality of data bits and the plurality of parity bits, wherein a first value of the plurality of syndrome bits is associated with an error in the first memory cell, a second value of the plurality of syndrome bits is associated with an error in the second memory cell, and a third value of the plurality of syndrome bits is associated with an error in each of the first and the second memory cell.

2. The apparatus of claim 1, wherein the first memory cell and the second memory cell are adjacent to each other.

3. The apparatus of claim 1, wherein the ECC circuit is further configured repair the error in based on the value of the plurality of syndrome bits.

4. The apparatus of claim 3, wherein if the plurality of syndrome bits have the third value, the ECC circuit is configured to change a state of data read from the first and the second memory cell.

5. The apparatus of claim 1, wherein there are N data bits in the plurality of data bits, and wherein there are M values of the plurality of syndrome bits where M is greater than N.

6. The apparatus of claim 1, wherein the ECC circuit comprises:
   a first logic tree configured to generate a first plurality of preliminary parity bits associated with the first memory cell;
   a second logic tree configured to generate a second plurality of preliminary parity bits associated with the second memory cell; and
   a third logic tree configured to combine the first plurality of preliminary parity bits and the second plurality of preliminary parity bits to generate the plurality of parity bits.

7. The apparatus of claim 1, wherein the ECC circuit is configured to generate a plurality of parity bits based on the plurality of syndrome bits, and write the plurality of parity bits to the word line during a write operation.

8. A method comprising:
   receiving a plurality of data bits and a plurality of parity bits;
   generating a plurality of syndrome bits based on the plurality of data bits and the plurality of parity bits, wherein the plurality of syndrome bits are associated with a set of syndrome values, wherein a first portion of the set of values is associated with each individual one of the plurality of data bits and wherein a second portion of the set of values is associated with selected pairs of the plurality of data bits.

9. The method of claim 8, wherein the selected pairs represent a first memory cell and a second memory cell adjacent along a word line.

10. The method of claim 8, further comprising:
identifying an error in one of the plurality of data bits or in one of the selected pairs of the plurality of data bits based on the plurality of syndrome bits; and
correcting the identified error.

11. The method of claim 10, wherein correcting the identified error in one of the selected pairs of the plurality of data bits comprises changing a state of a first data bit and a second data.

12. The method of claim 8, further comprising writing the plurality of data bits and a plurality of parity bits based on the plurality of syndrome bits to a memory array as part of a write operation.

13. The method of claim 8, wherein the first portion of the set of values includes a first section and a second section; the method comprising combining a value from the first section and a value from the second section to generate a value from the second portion.

14. The method of claim 13, further comprising changing determining the value from the first section and the value from the second section based on a row address associated with the plurality of data bits.

15. An apparatus comprising:
an ECC circuit configured to receive a plurality of data bits and generate a plurality of parity bits based on a syndrome value, wherein the ECC circuit comprises:
a first logic tree configured to generate a first syndrome value associated with a first one of the plurality of data bits;
a second logic tree configured to generate a second syndrome value associated with a second one of the plurality of data bits; and
a third logic tree configured to generate a third syndrome value based on the first syndrome value and the second syndrome value, wherein the third syndrome value is associated with the first and the second one of the plurality of data bits.

16. The apparatus of claim 15, wherein the first data bit is read out along a first bit line, the second data bit is read out along a second bit line, and a third data bit is read out along a third bit line, wherein the apparatus further comprises a multiplexer configured to couple the first bit line to the first logic tree and the second bit line to the second logic tree or the second bit lien to the first logic tree and the third bit line to the second logic tree based on a row address.

17. The apparatus of claim 16, wherein the multiplexer is configured to changing the coupling of the bit lines based on whether the row address is even or odd.

18. The apparatus of claim 15, wherein the first one of the plurality of bits is adjacent to the second one of the plurality of bits along a word line.

19. The apparatus of claim 15, wherein the ECC circuit is further configured to repair an error in the plurality of data bits based on the syndrome value.

20. The apparatus of claim 19, wherein the ECC circuit is further configured to change the first and the second one of the plurality of data bits based on the third syndrome value.

\* \* \* \* \*